(12) United States Patent  (10) Patent No.: US 9,214,229 B2
Cheng et al.  (45) Date of Patent: Dec. 15, 2015

(54) PHASE CHANGE MEMORY MATERIAL AND SYSTEM FOR EMBEDDED MEMORY APPLICATIONS

(71) Applicant: MACRONIX INTERNATIONAL CO., LTD., Hsinchu (TW)

(72) Inventors: Huai-Yu Cheng, White Plains, NY (US); Hsiang-Lan Lung, Ardsley, NY (US); Che-Min Lin, Kaohsiung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/309,776

(22) Filed: Jun. 19, 2014

(65) Prior Publication Data

US 2014/0376309 A1  Dec. 25, 2014

Related U.S. Application Data

(60) Provisional application No. 61/837,645, filed on Jun. 21, 2013.

(51) Int. Cl.
*G11C 13/00* (2006.01)
*H01L 45/00* (2006.01)

(52) U.S. Cl.
CPC ........ *G11C 13/0069* (2013.01); *G11C 13/0004* (2013.01); *H01L 45/06* (2013.01); *H01L 45/1233* (2013.01); *H01L 45/144* (2013.01); *H01L 45/1625* (2013.01); *G11C 2013/0083* (2013.01); *G11C 2213/79* (2013.01)

(58) Field of Classification Search
CPC .......... G11C 13/0004; G11C 13/0069; G11C 2013/0083; G11C 2213/79; H01L 45/06; H01L 45/144; H01L 45/1233; H01L 45/1625
USPC ................... 365/163, 100, 148, 158
See application file for complete search history.

(56) References Cited

U.S. PATENT DOCUMENTS

| | | |
|---|---|---|
| 8,605,497 B2 * | 12/2013 | Lam et al. ...................... 365/163 |
| 2007/0247899 A1 * | 10/2007 | Gordon et al. ................. 365/163 |
| 2011/0317480 A1 | 12/2011 | Lung et al. |
| 2012/0326111 A1 | 12/2012 | Cheng et al. |

OTHER PUBLICATIONS

Cheng et al., "A thermally robust phase change memory by engineering the Ge/N concentration in (Ge, N)xSbyTe z phase change material," 2012 Int'l IEEE IEDM, Dec. 10-13, 2012, 4 pages.

Cheng, et al., "A high performance phase change memory with fast switching speed and high temperature retention by engineering the GexSbyTez phase change material," 2011 IEEE Int'l IEDM, Dec. 5-7, 2011, 4 pages.

(Continued)

*Primary Examiner* — Tan T Nguyen
(74) *Attorney, Agent, or Firm* — Yiding Wu; Haynes Beffel & Wolfeld LLP

(57) ABSTRACT

A family of phase change materials $Ge_wSb_xTe_yN_z$ having a crystallization temperature greater than 410° C., wherein a Ge atomic concentration is within a range from 43% to 54%, a Sb atomic concentration is within a range from 6% to 13%, a Te atomic concentration is within a range from 14% to 23%, and a N atomic concentration is within a range of 15% to 27%, is described. A method for programming a memory device including such phase change materials is also described.

20 Claims, 14 Drawing Sheets

(56) References Cited

OTHER PUBLICATIONS

Shih, et al, "Mechanisms of retention loss in Ge2Sb2Te5-based Phase-Change Memory," 2008 IEEE Int'l IEDM, Dec. 15-17, 2008, 4 pages.

Wu, et al., "A low power phase change memory using thermally confined TaN/TiN bottom electrode," 2011 IEEE Int'l IEDM, Dec. 5-7, 2011, 4 pages.

* cited by examiner

| Materials | Label in Fig. 1 | Tx (°C) | Reset current (uA) (chip data) | Recrystallization Time (ns) (x=90%) | Set Speed (ns) (chip data) |
|---|---|---|---|---|---|
| GST-225 | 103 | 150 | > 400 | 55 | < 80 |
| G | 104 | 253 | >=150 | 200 | 80 |
| A | 106 | 295 | 100~150 | 560 | 80 |
| B | 105 | 316 | 100~150 | 1705 | 80 |
| C | 102 | 413 | 50~100 | 3115 | 160~240 |

PHASE CHANGE MEMORY MATERIAL AND SYSTEM FOR EMBEDDED MEMORY APPLICATIONS

RELATED APPLICATIONS

This application claims the benefit of U.S. Provisional Patent Application No. 61/837,645, filed 21 Jun. 2013, which is incorporated herein by reference.

BACKGROUND OF THE INVENTION

1. Field of the Invention

The present invention relates to memory devices based on phase change memory materials.

2. Description of Related Art

Phase change memory materials, like chalcogenide based materials and similar materials, can be caused to change phase between an amorphous state and a crystalline state by application of electrical current at levels suitable for implementation in integrated circuits. The generally amorphous state is characterized by higher electrical resistivity than the generally crystalline state, which can be readily sensed to indicate data. These properties have generated interest in using programmable resistive material to form nonvolatile memory circuits, which can be read and written with random access.

The change from the amorphous to the crystalline state, referred to as set herein, is generally a lower current operation. The change from crystalline to amorphous state, referred to as reset herein, is generally a higher current operation, which includes a short high current density pulse to melt or breakdown the crystalline structure, after which the phase change material cools quickly, quenching the phase change process and allowing at least a portion of the phase change material to stabilize in the amorphous state.

In phase change memory, data is stored by causing transitions in an active region of the phase change material between amorphous and crystalline states. The difference between the highest resistance $R_1$ of the low resistance crystalline set state and the lowest resistance $R_2$ of the high resistance amorphous reset state defines a read margin used to distinguish cells in the crystalline set state from those in the amorphous reset state. The data stored in a memory cell can be determined by determining whether the memory cell has a resistance corresponding to the low resistance state or to the high resistance state, for example by measuring whether the resistance of the memory cell is above or below a threshold resistance value within the read margin.

Materials within the GST-225 family include GeSbTe compositions along the $Sb_2Te_3$ and GeTe tie line as reported in "Structural, electric and kinetic parameters of ternary alloys of GeSbTe", E. Morales-Sanchez, Thin Solid Films 471 (2005) 243-247. Relatively low crystallization temperature Tx of materials in the GST-225 family (e.g., Tx~150° C.) can cause phase change memory cells fabricated from materials in the GST-225 family undergo undesired transformation from the amorphous reset state to the crystalline set state at elevated temperatures. The undesired transformation of the phase change material within the active region of memory cells at elevated operation temperatures leads to the creation of false data and the loss of desired stored data.

Many embedded system applications such as automotive electronics require pre-coding of memory devices where data are pre-programmed into a memory chip before the memory chip is mounted onto a substrate such as a printed circuit board (PCB). During the mounting process, the memory chip is subject to thermal cycles for solder reflow that can reach an elevated temperature of 260° C. The relatively low crystallization temperature of materials in the GST-225 family severely limits usability of memory devices based on materials in the GST-225 family in embedded system applications as data pre-coded in GST-225 based memory devices can be lost after the memory devices are mounted due to the elevated temperature of the mounting process.

It is therefore desirable to provide a phase change material with a high crystallization temperature to prevent undesired transformation from the amorphous reset state to the crystalline set state at elevated temperatures. It is also desirable to provide a method for programming a memory including memory cells based on the phase change material with a high crystallization temperature.

SUMMARY OF THE INVENTION

The present invention provides a family of phase change materials $Ge_wSb_xTe_yN_z$ having a crystallization temperature greater than 410° C., wherein a Ge atomic concentration is within a range from 43% to 54%, a Sb atomic concentration is within a range from 6% to 13%, a Te atomic concentration is within a range from 14% to 23%, and a N atomic concentration is within a range of 15% to 27%.

The present invention also provides a method for programming a memory device including phase change memory cells comprising such phase change materials. The method includes performing pre-coding operations before the device is mounted to a substrate. The pre-coding operations include storing a first data value in a first set of the phase change memory cells by applying to the first set of cells a reset pulse, causing the first set of cells to transition to an amorphous reset state. The first set of cells in the amorphous reset state has a first resistance range.

The pre-coding operations also include storing a second data value in a second set of the phase change memory cells by applying to the second set of cells a set pulse sequence, causing the second set of cells to transition to a crystalline set state. The sequence includes set pulses with decreasing magnitudes that the pulses have a leading edge, a pulse width, and a trailing edge that is longer than the leading edge. The second set of cells in the crystalline set state has a second resistance range that is separate from the first resistance range by at least a margin.

Other aspects and advantages of the present invention can be seen on review of the drawings, the detailed description and the claims, which follow.

DETAILED DESCRIPTION

A detailed description of embodiments of the present invention is provided with reference to the Figures.

Figure 1:
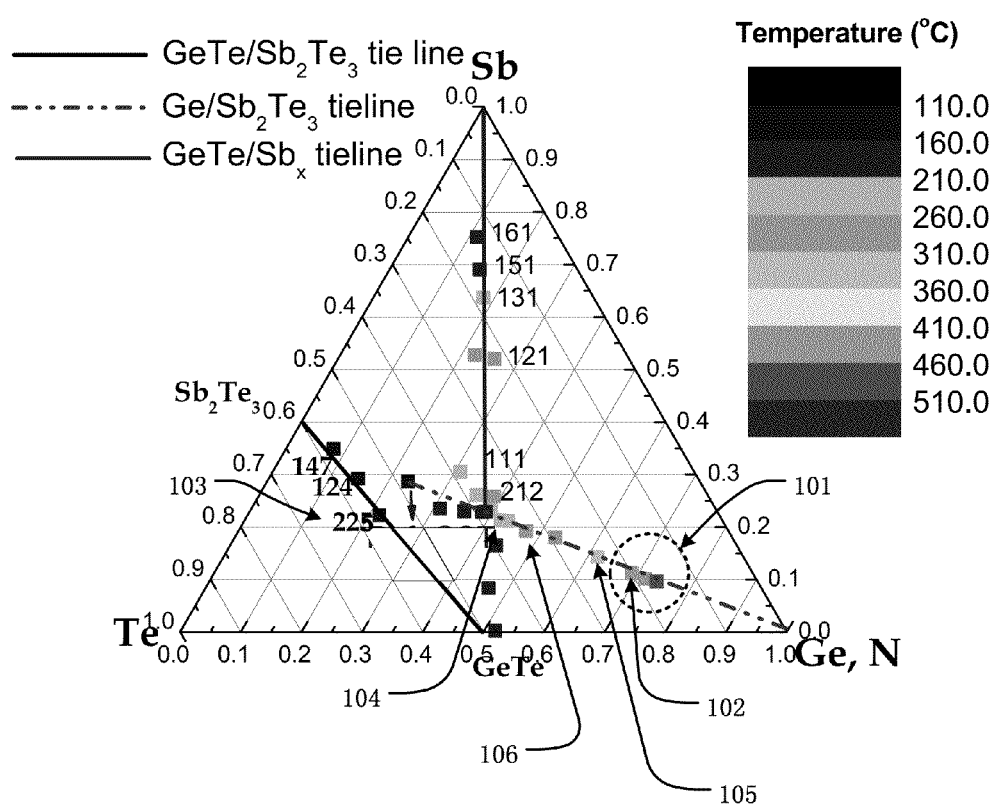
FIG. 1 is a ternary phase diagram that shows the crystallization temperature of GeSbTeN compositions at various atomic percentage concentrations.

FIG. 1 is a ternary phase diagram that shows the crystallization temperature using gray scale coding of spots at locations that correspond to GeSbTeN compositions at various atomic percentage concentrations. In particular embodiments, the high crystallization temperature compositions described here are located generally encompassed by shape 101 including the group $Ge_wSb_xTe_yN_z$ that has a Ge atomic percentage concentration ($w/(w+x+y+z)$) within a range from 43% to 54%, a Sb atomic percentage concentration ($x/(w+x+y+z)$) within a range from 6% to 13%, a Te atomic percentage concentration ($y/(w+x+y+z)$) within a range from 14% to 23%, and a N atomic percentage concentration ($z/(w+x+y+z)$) within a range of 15% to 27%. Here, w, x, y, and z are non-zero, positive numbers. The group includes a representative composition $Ge_{0.488}Sb_{0.103}Te_{0.193}N_{0.216}$ at location 102 in FIG. 1 that has a Ge atomic concentration at about 48.8%, a Sb atomic concentration at about 10.3%, a Te atomic concentration at about 19.3%, and an N atomic concentration at about 21.6%.

The group of materials $Ge_wSb_xTe_yN_z$ encompassed by the shape 101 is termed here "GSTN-5122 family" as the materials within the GSTN-5122 family generally have the w being about 5, the x being about 1, the y being about 2, and the z being about 2. That is, the atomic concentration ratio w:x:y:z among the Ge, Sb, Te, and N elements is about 5:1:2:2. Materials within the GSTN-5122 family have crystallization temperature greater than 410° C., which is at least 150° C. higher than the solder reflow temperature for the mounting process described earlier.

Figures 2, 3:
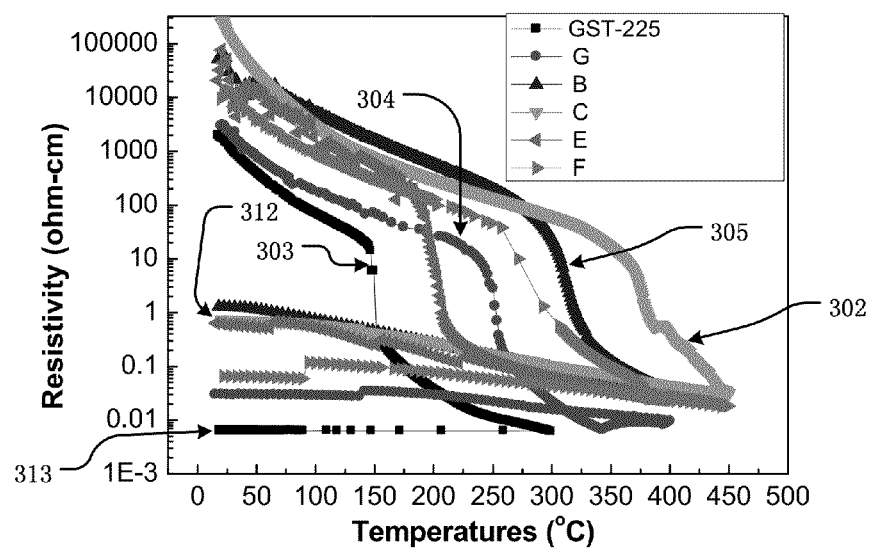
FIG. 2 illustrates crystallization temperatures, reset currents, recrystallization times, and set speeds for different phase change materials.
FIG. 3 compares the resistivity vs. temperature curves of phase change materials.

FIG. 2 illustrates crystallization temperatures, reset currents, recrystallization times, and set speeds for different phase change materials. As illustrated in FIG. 2, the phase change material $Ge_{0.488}Sb_{0.103}Te_{0.193}N_{0.216}$ (referred to as material C in FIG. 2) of the GSTN-5122 family has a crystallization temperature (Tx) at 413° C., which is at least about 100° C. higher than other phase change materials GST-225, G, B, and A listed in FIG. 2. As illustrated in FIG. 1, although GSTN-5122 phase change materials (including $Ge_{0.488}Sb_{0.103}Te_{0.193}N_{0.216}$) are generally along or near the $Ge/Sb_2Te_3$ tie line in the ternary phase diagram like the phase change material G (104 in FIG. 1), the phase change material A (106 in FIG. 1), and the phase change material B (105 in FIG. 1), the GSTN-5122 phase change materials have much higher (at least about 100° C. higher) crystallization temperature than other phase change materials along the $Ge/Sb_2Te_3$ tie line.

Material within the GSTN-5122 family such as $Ge_{0.488}Sb_{0.103}Te_{0.193}N_{0.216}$ (phase change material A and 102 in FIG. 1) and the phase change material B (105 in FIG. 1) can be made by co-sputtering physical vapor deposition (PVD) process with nitrogen reactive sputtering from a compound GST-225 target and an elemental Ge target. Composition of the resulting film can be varied by controlling the relative power for these two sputtering sources. The film composition can be determined by Rutherford Backscattering Spectrometry (RBS) and Particle-Induced X-ray Emission (PIXE) with an error of ±0.5 at. % for Ge and ±5.0 at. % for Sb and Te and N, respectively.

FIG. 3 compares the resistivity vs. temperature curves of phase change materials C (trace 302), B (trace 305), G (trace 304), and GST-225 (trace 303). A location in a resistivity vs. temperature curve of a phase change material where the resistivity dramatically decreases (the "knee" of the curve) generally indicates the crystallization temperature of the phase change material. As shown by locations of knees of the traces 302, 305, 304, and 303 in FIG. 3, the phase change material C ($Ge_{0.488}Sb_{0.103}Te_{0.193}N_{0.216}$ in the GSTN-5122 family) has much higher crystallization temperature than other phase change materials GST-225, G, and B depicted in FIG. 3.

Figure 4:
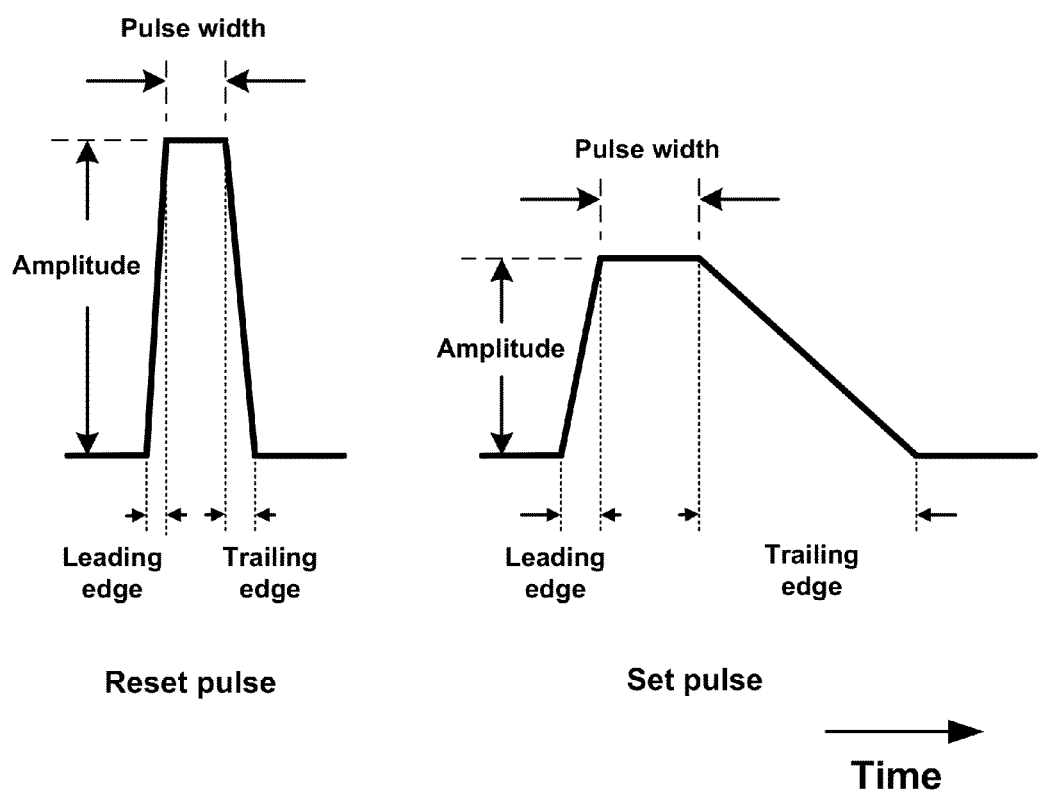
FIG. 4 illustrates example waveforms for a reset pulse and a set pulse.

The reset current is the amount of current that is required to transform a phase change memory material from a crystalline set state to an amorphous reset state. This reset current changes the temperature of a phase change memory material to a maximum melt temperature, so that a portion of the crystallized material melts. The melted portion of phase change material quenches quickly, thereby solidifying into an amorphous reset state. The reset current can be applied to a phase change material based memory cell using a short current pulse that has a sharply rising (leading) edge to a magnitude that delivers sufficient energy to the active region of the memory cell that the temperature in the active region exceeds the melting temperature of the phase change material, and hold at that temperature for a very short period of time (pulse width). The short reset current pulse also has a fast falling (trailing) edge that rapidly lowering the temperature to ambient so that the phase change material in the active region does not have time to crystallize before solidifying in the amorphous state. Alternatively, the set current is the amount of current that is required to transform the phase change memory material from an amorphous reset state to a crystalline set state. The set current causes the phase change memory material to rise above the crystallization temperature but below the maximum melt temperature, so that the phase change memory material crystallizes from the amorphous reset state. The set current can be applied to a phase change material based memory cell using a current pulse that has a rising (leading) edge on which the temperature of the phase change material in the active region of the memory cell increases from ambient to a temperature above the crystallization temperature and below the melting temperature, and hold at the temperature for a period of time (pulse width) sufficient to establish a set state. The set current pulse also has a falling (trailing) edge that falls relatively slowly lowering the temperature to ambient so that the phase change material in the active region settles in a low resistance, temperature-hardened morphology and crystalline state. FIG. 4 illustrates example waveforms for a reset pulse and a set pulse. The total duration (e.g., in nanoseconds or microseconds) of a reset (or set) pulse is the sum of durations of its leading edge, pulse width, and trailing edge.

As illustrated in FIG. 3, the resistivity of the phase change material C ($Ge_{0.488}Sb_{0.103}Te_{0.193}N_{0.216}$ in the GSTN-5122 family) in a crystalline set state (312) is about 1 Ω-cm. The resistivity of the GST-225 material in a crystalline set state (313) is below 0.01 Ω-cm. Thus, the reset current required to transform the phase change material C from the set crystalline state to the reset amorphous state can be much lower (4× lower) than the GST-225 material, as shown in FIG. 2.

Figure 5:
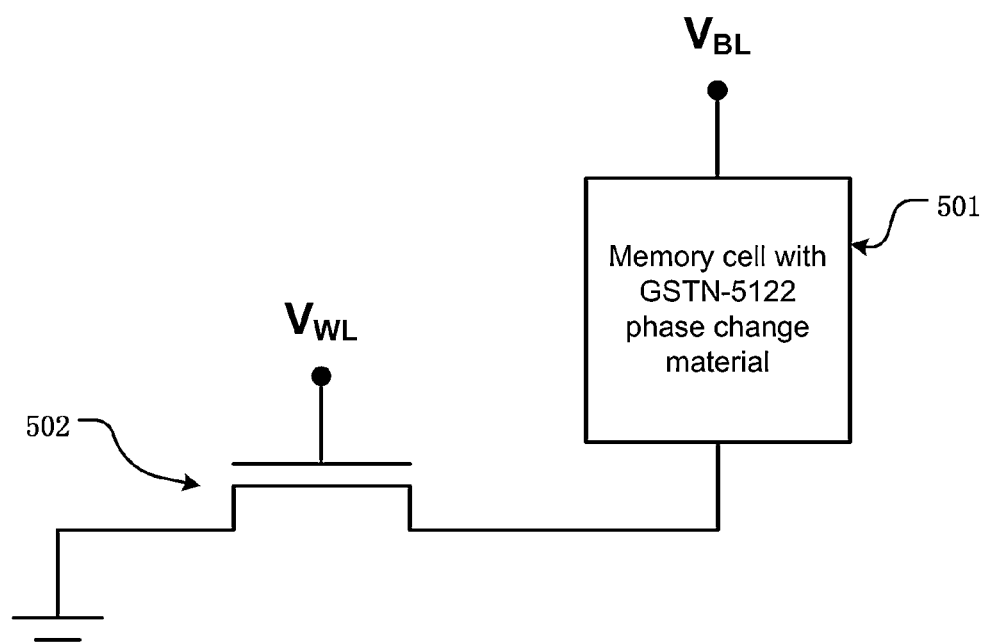
FIG. 5 is a schematic diagram of a phase change material based memory cell of a memory array and its programming voltage arrangement.

FIG. 5 is a schematic diagram of a phase change material based memory cell of a memory array and its programming voltage arrangement. In FIG. 5, a memory cell 501 includes a top electrode, a bottom electrode, and a body of the phase change material GSTN-5122. The memory cell 501 can be based on a thermally confined TaN/TiN/TaN ring bottom electrode cell, as described in J. Y. Wu et al., *A Low Power Phase Change memory Using Thermally Confined TaN/TiN Bottom Electrode*, IEDM Tech. Dig., 3.2, 2011. The top electrode is connected to a bit line of the memory array. The bottom electrode is connected to the source (or drain) of a transistor 502. The drain (or source) of the transistor 502 is connected to a reference ground. The gate of the transistor 502 is connected to a word line of the memory array. In FIG. 5, the bit-line voltage ($V_{BL}$) is kept at a constant voltage (e.g., 2.5V). Various word-line voltage ($V_{WL}$) is provided to control the transistor 502 and apply set or reset current to the memory cell 501, causing the memory cell 501 to transition between the crystalline set state and the amorphous reset state. Herein, the resistance of a memory cell in the crystalline set state is termed set resistance. The resistance of a memory cell in the amorphous reset state is termed reset resistance.

Figure 6A:
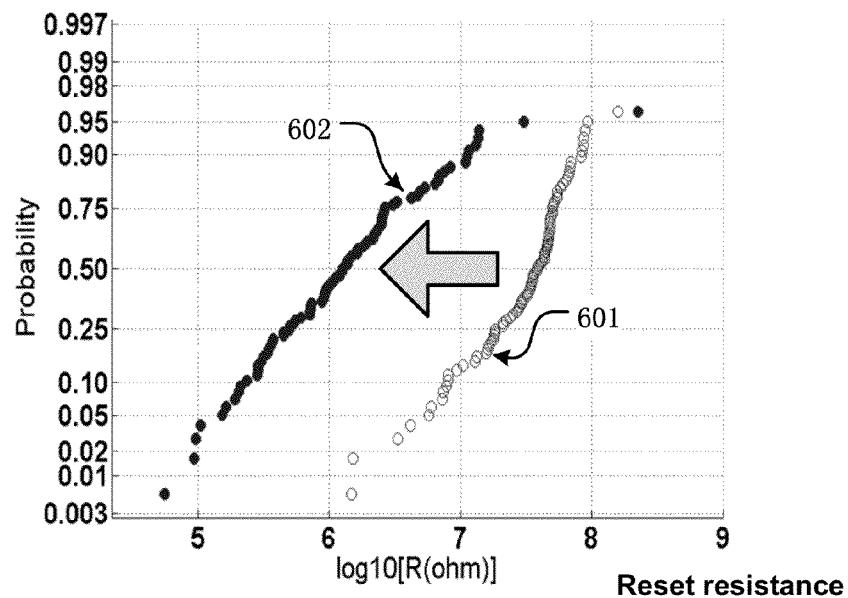
FIGS. 6A and 6B illustrate cumulative distribution curves of reset resistance of memory cells based on phase change materials.

Ordinarily, for memory cells based on conventional phase change material such as GST-225 material, the resistance of a memory cell in the amorphous reset state decreases when the memory cell is subject to an elevated temperature (such as the solder reflow temperature described earlier) that is higher than the crystallization temperature of the conventional phase change material, as illustrated in FIG. 6A. FIG. 6A illustrates cumulative distribution curves of reset resistance of memory cells based on dielectric-doped GST-225 phase change material, before the memory cells are subject to the reflow temperature (trace 601) and after the memory cells are subject to the reflow temperature (trace 602). The memory cells are first transitioned to the amorphous reset state (trace 601) with a reset pulse having a leading edge of 19 nanoseconds, a pulse width of 40 nanoseconds, a trailing edge of 2 nanoseconds, and 700 micro-Amps in magnitude (or equivalently about 2V in word-line voltage).

As shown in FIG. 6A, the reset resistance range of the memory cells based on dielectric-doped GST-225 phase change material decreases after the memory cells are subject to a solder reflow temperature of about 260° C., which is higher than the crystallization temperature of the dielectric-doped GST-225 phase change material (Tx~200° C.). The cumulative distribution curve of reset resistance of the memory cells generally shifts toward left (as indicated by the arrow) after the memory cells are subject to the reflow temperature. The range of the reset resistance of most of the memory cells is between about $10^6 Ω$ and $10^8 Ω$ before the memory cells are subject to the reflow temperature (trace 601). The range of the reset resistance of most of the memory cells is between about $10^5 Ω$ and $10^7 Ω$ after the memory cells are subject to the reflow temperature (trace 602). The medium reset resistance of the memory cells decreases by about 30 times (30×) after the memory cells are subject to the reflow temperature. More particularly, the decrease in the minimal reset resistance (from $10^{6.1} Ω$ to $10^{4.6} Ω$ in FIG. 6A) can significantly reduce the read margin (between minimal reset resistance and maximal set resistance) for these memory cells based on the dielectric-doped GST-225 phase change material.

Figure 6B:
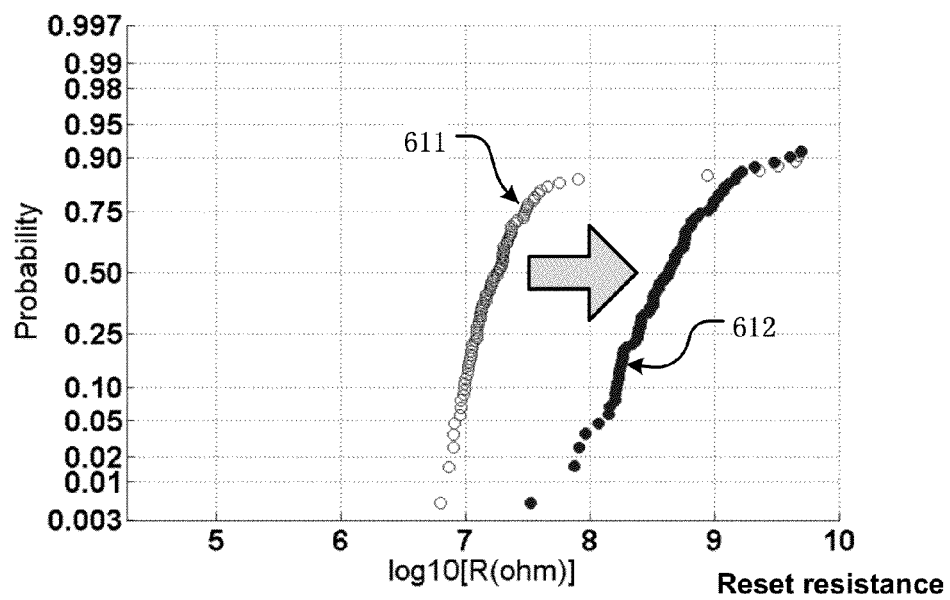

In contrast, the minimal reset resistance of memory cells based on GSTN-5122 phase change material increases after the memory cells are subject to the solder reflow temperature. FIG. 6B illustrates cumulative distribution curves of reset resistance of memory cells based on the GSTN-5122 phase change material C (e.g., memory cell 501 illustrated in FIG. 5), before the memory cells are subject to the reflow temperature (trace 611) and after the memory cells are subject to the reflow temperature (trace 612). The memory cells are transitioned to the amorphous reset state (trace 611) with a reset pulse having a leading edge of 19 nanoseconds, a pulse width of 40 nanoseconds, a trailing edge of 2 nanoseconds, and 700 micro-Amps in magnitude (i.e., the same waveform as the reset pulse applied to the memory cells based on dielectric-doped GST-225 phase change material illustrated in FIG. 6A above).

As shown in FIG. 6B, the cumulative distribution curve of reset resistance of the memory cells based on GSTN-5122 phase change material generally shifts toward right (as indicated by the arrow) after the memory cells are subject to the reflow temperature. The reset resistance range of the memory cells based on GSTN-5122 phase change material increases after the memory cells are subject to solder reflow temperature of about 260° C., which is lower than the crystallization temperature of the GSTN-5122 phase change material (Tx>=410° C.). The range of the reset resistance of most of the memory cells is between about $10^{6.8} Ω$ and $10^8 Ω$ before the memory cells are subject to the reflow temperature (trace 611). The range of the reset resistance of the most of the memory cells is between about $10^{7.5} Ω$ and $10^{9.6} Ω$ after the memory cells are subject to the reflow temperature. The medium reset resistance increases by about 25 times (25×) after the memory cells subject to the reflow temperature. More particularly, the increase in the minimal reset resistance (from $10^{6.8} Ω$ to $10^{7.5} Ω$) does not introduce a negative effect on the read martin (between minimal reset resistance and maximal set resistance) of these memory cells based on GSTN-5122 phase change materials, after the memory cells are subject to the elevated solder reflow temperature.

Figure 7:
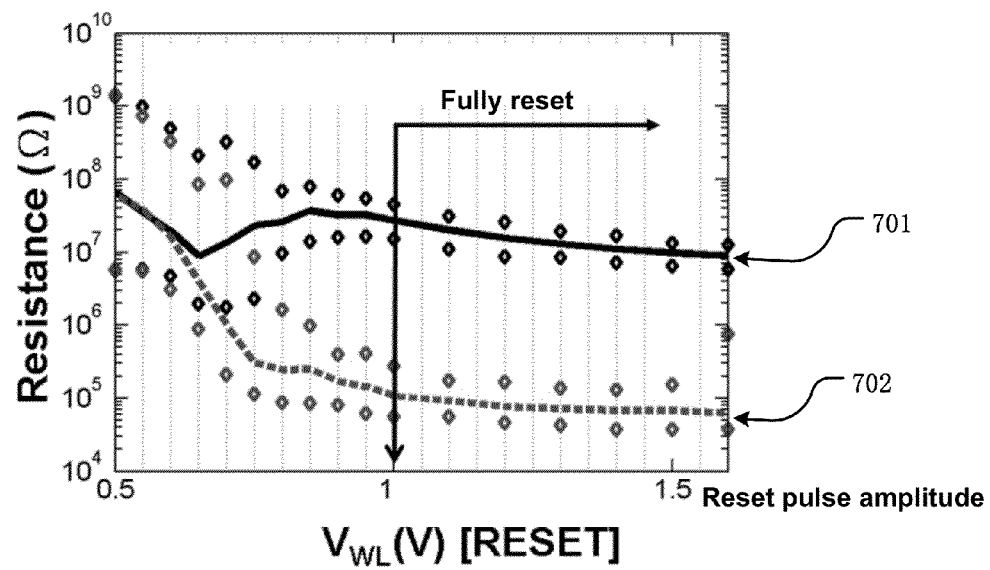
FIG. 7 illustrates resistance vs. applied voltage characteristics of memory cells based on a phase change material.

FIG. 7 illustrates resistance vs. applied voltage characteristics of memory cells based on the GSTN-5122 phase change material C (e.g., memory cell 501 illustrated in FIG. 5). In FIG. 7, trace 701 is the mean value of resistance of the memory cells as a function of an amplitude (in word-line voltage $V_{WL}$) of a reset pulse applied to the memory cells. The reset pulse has a leading edge of 19 nanoseconds, a pulse width of 40 nanoseconds, and a trailing edge of 2 nanoseconds. The dots above and below the trace 701 represents 80% and 20% resistance values. Trace 702 is the mean value of resistance of the memory cells as a function of the word-line voltage of a set pulse applied to the memory cells.

In FIG. 7, the generally flattened portion of trace 701 above 1V in word-line voltage indicates that the memory cells have transitioned to the reset amorphous state ("fully reset") when the reset pulse applied to the memory cells has an amplitude equal to or greater than 1V. That is, a reset pulse with an amplitude of 1V is sufficient to transition the memory cells to the reset amorphous state.

Figure 8:
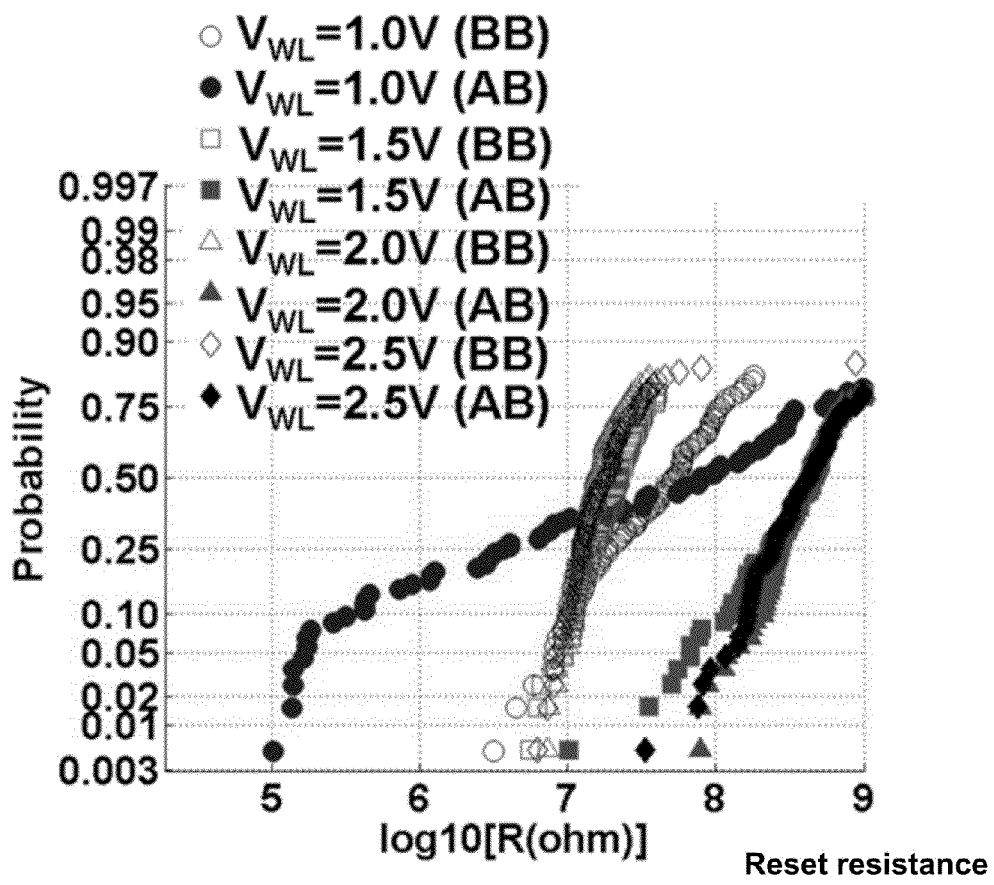
FIG. 8 illustrates cumulative distribution curves of reset resistance of memory cells based on a phase change material.

FIG. 8 illustrates cumulative distribution curves of reset resistance of memory cells based on the GSTN-5122 phase change material C (e.g., memory cell 501 illustrated in FIG. 5). In FIG. 8, a reset pulse of various amplitudes (in different word-line voltages $V_{WL}$) is applied to the memory cells, causing the memory cells to transition to the amorphous reset state. The reset pulse has a leading edge of 19 nanoseconds, a pulse width of 40 nanoseconds, and a trailing edge of 2 nanoseconds. In FIG. 8, "BB" ("before baking") indicates reset resistance of the memory cells in the amorphous reset state but before the memory cells are subject to solder reflow temperature of about 260° C. "AB" ("after baking") indicates reset resistance of the memory cells after the memory cells are subject to the reflow temperature of about 260° C. Similarly to FIG. 6B described earlier, for a reset voltage equal to or greater than 1.5V, the minimal reset resistance of the memory cells based on GSTN-5122 phase change material increases after the memory cells are subject to the reflow temperature of about 260° C., which is lower than the crystallization temperature of the GSTN-5122 phase change material (Tx>=410° C.). Meanwhile, the minimal reset resistance of the memory cells receiving a 1V reset pulse decreases after the memory cells are subject to the reflow temperature. As described with FIG. 7, although a 1V reset pulse is sufficient to transition the GSTN-5122 phase change material C based memory cells to the amorphous reset state, a stronger (1.5V or higher) reset pulse can cause an increase the minimal reset resistance after the memory cells are subject to the reflow temperature. It also has been observed using transmission electron microscopy (TEM) that the stronger (1.5V or higher) reset pulse results in a larger amorphous region in the GSTN-5122 phase change material C that is less likely to disappear (crystallize) during the reflow process (with the elevated temperature), thus can maintain the reset resistance after the reflow process.

Figure 9A:
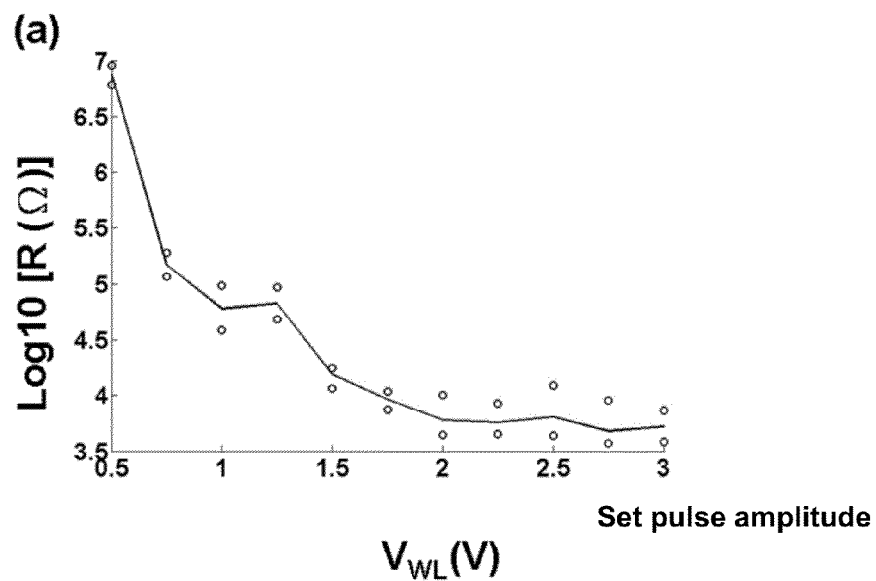
FIGS. 9A and 9B illustrate resistance vs. applied voltage characteristics of memory cells based on phase change materials.

FIG. 9A illustrates resistance vs. applied voltage characteristics of memory cells based on conventional phase change material GST-225. In FIG. 9A, a single set pulse with 100-nanoseconds leading edge, 140-nanoseconds pulse width, 1-microsecond trailing edge is applied to the memory cells to transition the memory cells to the crystalline set state. The solid line in FIG. 9A is the mean value of the resistance of the memory cells. The dots above and below the solid line are the 80% and 20% resistance values of the memory cell (at a given word-line voltage $V_{WL}$). As shown in FIG. 9A, the resistance of the memory cells generally decreases with increasing amplitude (in word-line voltage $V_{WL}$) of the set pulse. That is, a strong enough set pulse can cause the memory cells to transition to the crystalline set state such that the maximal resistance value of the memory cells is low enough for a sufficient read margin.

Figure 9B:
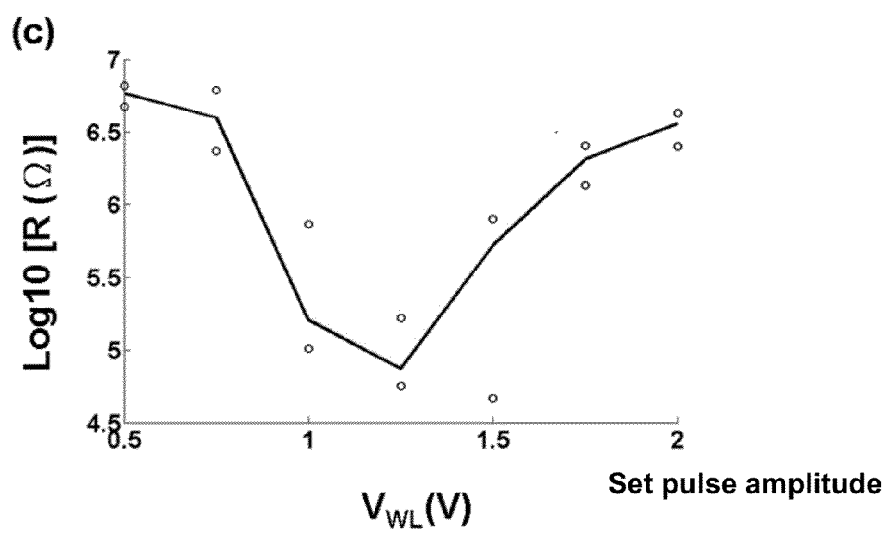

FIG. 9B illustrates resistance vs. applied voltage characteristics of memory cells based on the GSTN-5122 phase change material C (e.g., memory cell 501 illustrated in FIG. 5). In FIG. 9B, a set pulse with 100-nanoseconds leading edge, 140-nanoseconds pulse width, 1-microsecond trailing edge is applied to the memory cells to transition the memory cells to the crystalline set state. The solid line in FIG. 9B is the mean value of the resistance of the memory cells. The dots above and below the solid line are the 80% and 20% resistance values (at a given word-line voltage $V_{WL}$) of the memory cell. As illustrated by the U-shape of the mean-value curve, it is difficult to only use a single set pulse with a high enough amplitude to transition the memory cells based on GSTN-5122 phase change material to the crystalline set state with a sufficiently low maximal set resistance (for a large enough read margin). Instead of using a single set pulse, a sequence of set pulse can be used to transition GSTN-5122 based phase change memory cells to the crystalline set state with a sufficiently low maximal set resistance, as described below.

Figure 10:
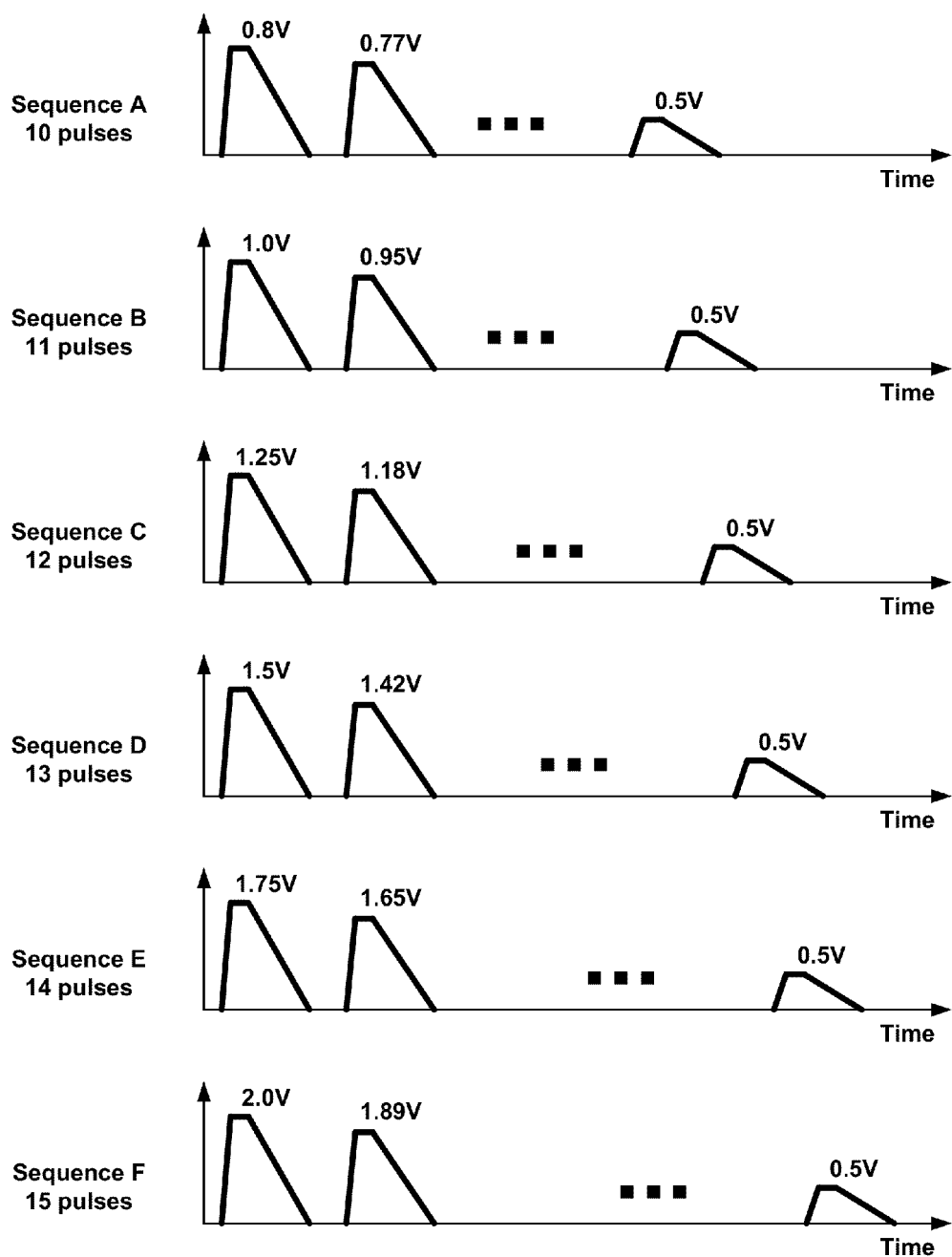
FIG. 10 illustrates example sequences of set pulses.

FIG. 10 illustrates example sequences of set pulses. Each sequence includes multiple pulses with decreasing magnitudes. More particularly, each sequence includes pulses with arithmetically decreasing magnitudes (i.e., decreasing in arithmetic progression order). For example, a sequence A has 10 pulses, with a starting pulse of 0.8V, followed by a second pulse of 0.77V, a third pulse of 0.73V, and so on. For example, a sequence B has 11 pulses, with a starting pulse of 1.0V, followed by a second pulse of 0.95V, a third pulse of 0.9V, and so on. From sequence A to F, both the number of pulses and the starting magnitude increase. The last pulse for each of the sequences A to F has a magnitude of 0.5V. Each pulse in each sequence has a 100-nanoseconds leading edge, a 145-nanoseconds pulse width, and a one-microsecond trailing edge. Each of the set pulse sequences A to F is applied to memory cells based on the GSTN-5122 phase change material C, and cause the memory cells to transition to the crystalline set state.

Figure 11:
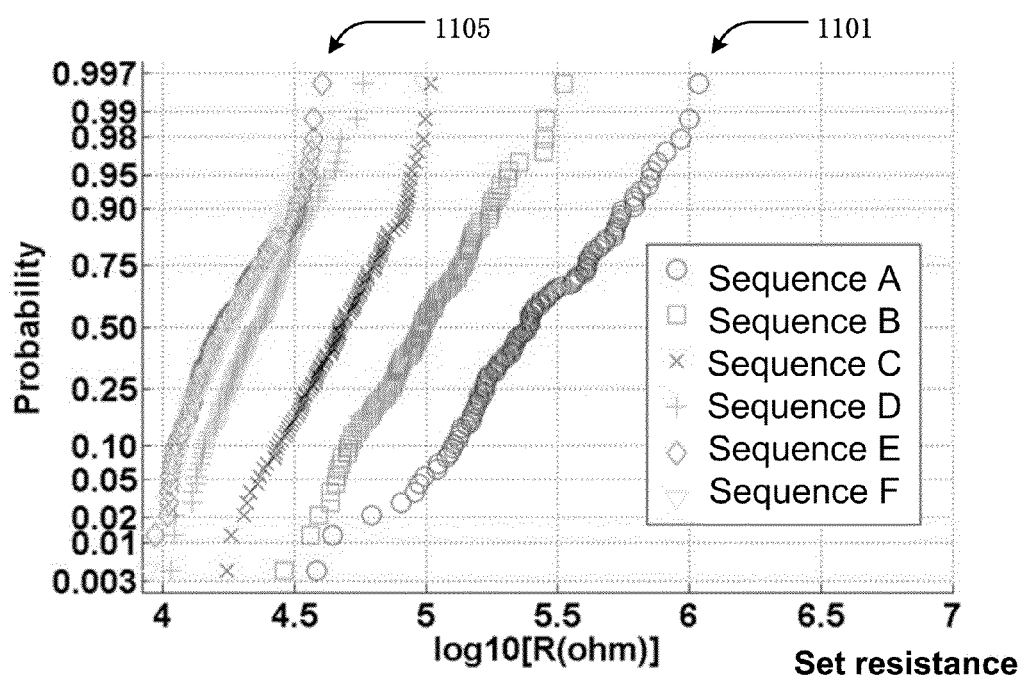
FIGS. 11 and 12 illustrate cumulative distribution curves of set resistance of memory cells based on a phase change material.

FIG. 11 illustrates cumulative distribution curves of set resistance of memory cells based on the GSTN-5122 phase change material C (e.g., memory cell 501 illustrated in FIG. 5). Each of the cumulative distribution curves represents set resistance of the memory cells caused to transition to the crystalline set state by a particular pulse sequence A, B, . . . , or F. As shown in FIG. 11, the median (or mean) value and maximal value of the set resistance range generally decrease while the width of the set resistance range generally narrows with a longer set pulse sequence that has a larger starting magnitude. For example, the cumulative distribution curve 1101 corresponding to the sequence A (with 10 pulses and a starting magnitude of 0.8V) has a range of about $10^{4.5}\Omega$ to $10^{6}\Omega$, and a median resistance value about $10^{5.4}\Omega$. In comparison, the cumulative distribution curve 1105 corresponding to the sequence E (with 14 pulses and a starting magnitude of 1.75V) has a range of about $10^{4}\Omega$ to $10^{4.5}\Omega$, and a median resistance value about $10^{4.2}\Omega$. Also note that the curve 1105 (corresponding to the sequence E) has the lowest maximal set resistance of the memory cells (about $10^{4.6}\Omega$), thus the largest possible read margin.

Figure 12:
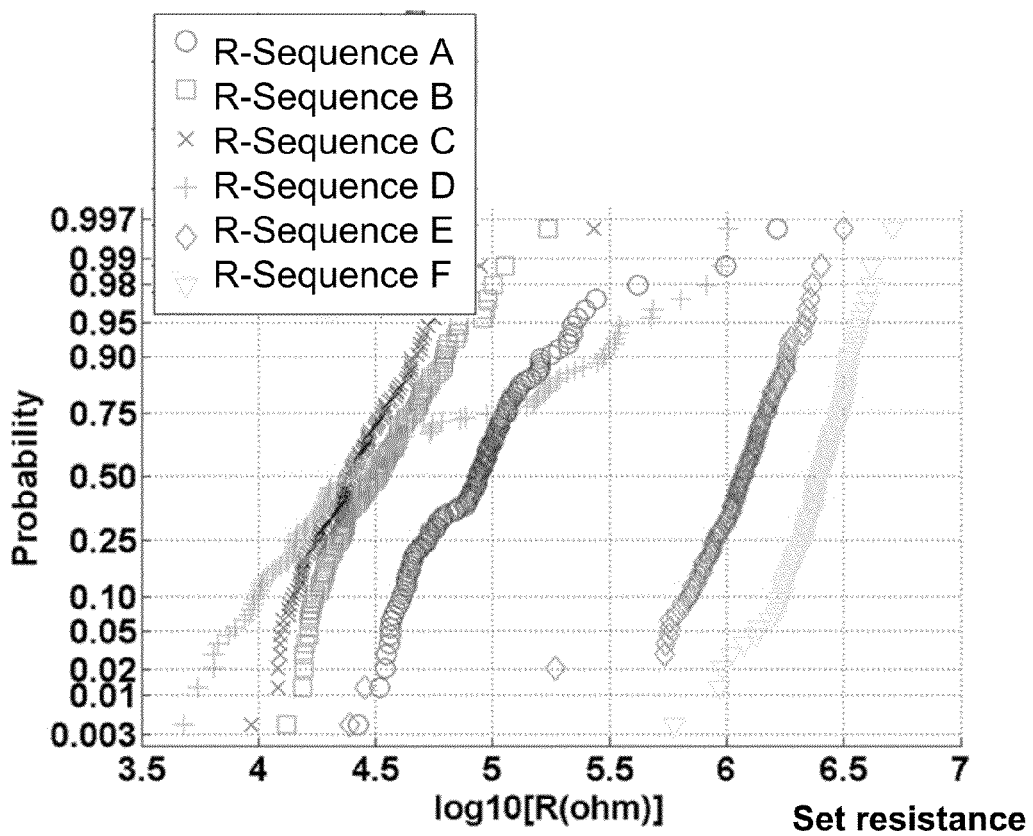

However, applying the sequence A, B, . . . , or F in a reversed order (starting with the smallest pulse and followed by pulses with arithmetically increasing magnitudes) to the memory cells based on GSTN-5122 phase change material does not have the desired property as illustrated in FIG. 11. FIG. 12 illustrates cumulative distribution curves of set resistance of memory cells based on the GSTN-5122 phase change material C in response to the reversed set pulse sequences A to F. Note that the reversed sequence with larger number of pulses (e.g., the sequences E and F) increases the set resistance of the memory cells. Furthermore, the lowest maximal set resistance (caused by the reversed sequence B) is about $10^{5.2}\Omega$, which is higher (thus less desirable) than the lowest maximal set resistance of about $10^{4.6}\Omega$ caused by the sequence E (curve 1105 in FIG. 11).

As illustrated with FIG. 8, by using a sufficiently strong reset pulse to transition memory cells based on GSTN-5122 phase change material to the amorphous reset state, the minimal reset resistance of the memory cells increases after the memory cells are subject to the elevated solder reflow temperature. Meanwhile, as illustrated with FIG. 11, a sequence of set pulses with decreasing magnitudes can be applied to the memory cells based on GSTN-5122 phase change material, causing the memory cells to transition to the crystalline set state with a low maximal set resistance. It is thus possible to apply the sufficiently strong reset pulse and the sequence of set pulses with decreasing magnitudes to memory cells based on GSTN-5122 phase change material to achieve a large read margin (between the maximal set resistance and the minimal reset resistance), before and after the memory cells subject to an elevated temperature such as the solder reflow temperature, as illustrated in FIG. 13.

Figure 13:
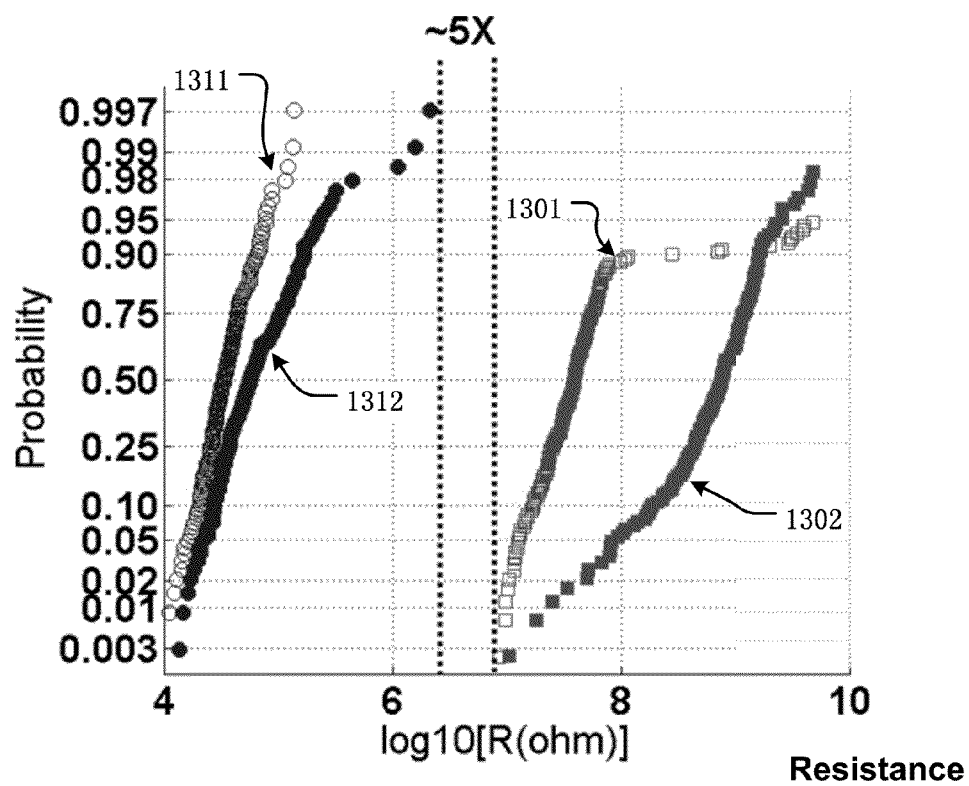
FIG. 13 illustrates cumulative distribution curves of set and reset resistances of memory cells based on a phase change material.

FIG. 13 illustrates cumulative distribution curves of resistance of memory cells based on the GSTN-5122 phase change material C. Curve 1301 corresponds to reset resistance of the memory cells in the amorphous reset state caused by applying to the memory cells a strong reset pulse having an amplitude of 2V in word-line voltage, a 19-nanoseconds leading edge, a 40-nanoseconds pulse width, and 2-nanoseconds trailing edge. Curve 1311 corresponds to set resistance of the memory cells in the crystalline set state caused by applying to the memory cells the sequence E described with FIG. 10 above. The low maximal set resistance and the high minimal reset resistance creates a wide read margin between about $10^{5.1}\Omega$ and $10^{6.8}\Omega$, or about 50 times (50×). In FIG. 13, curve 1302 corresponds to reset resistance of the memory cells after the memory cells are subject to the reflow temperature of about 260° C. Curve 1312 corresponds to the set resistance of the memory cells after the memory cells are subject to the reflow temperature. Although the maximal set resistance increases due to the reflow temperature, the minimal reset resistance also increases at the same time, yielding a narrower but still sufficient read margin of about 5 times (5×).

Based on the properties of the GSTN-5122 phase change material and the set and reset waveforms described above, particular embodiments provide methods for programming a phase change memory chip that can be used for embedded system applications. Particular embodiments include pre-coding the memory chip using a first set of reset and set pulses. Particular embodiments then mount the pre-coded memory chip to a substrate such as a PCB board, including subjecting the memory chip to one or more thermal cycle for solder reflow that can have an elevated reflow temperature of about 260° C. After the mount, the mounted memory chip is then deployed to the filed. For example, the mounted memory chip can be used in an in-car computer system. The pre-coded data are preserved and still available after the memory chip is deployed. In addition, particular embodiments may program additional data into the mounted memory chip by using a second set of reset and set pulses that have different waveforms from the first set of reset and set pulses.

Figure 14:
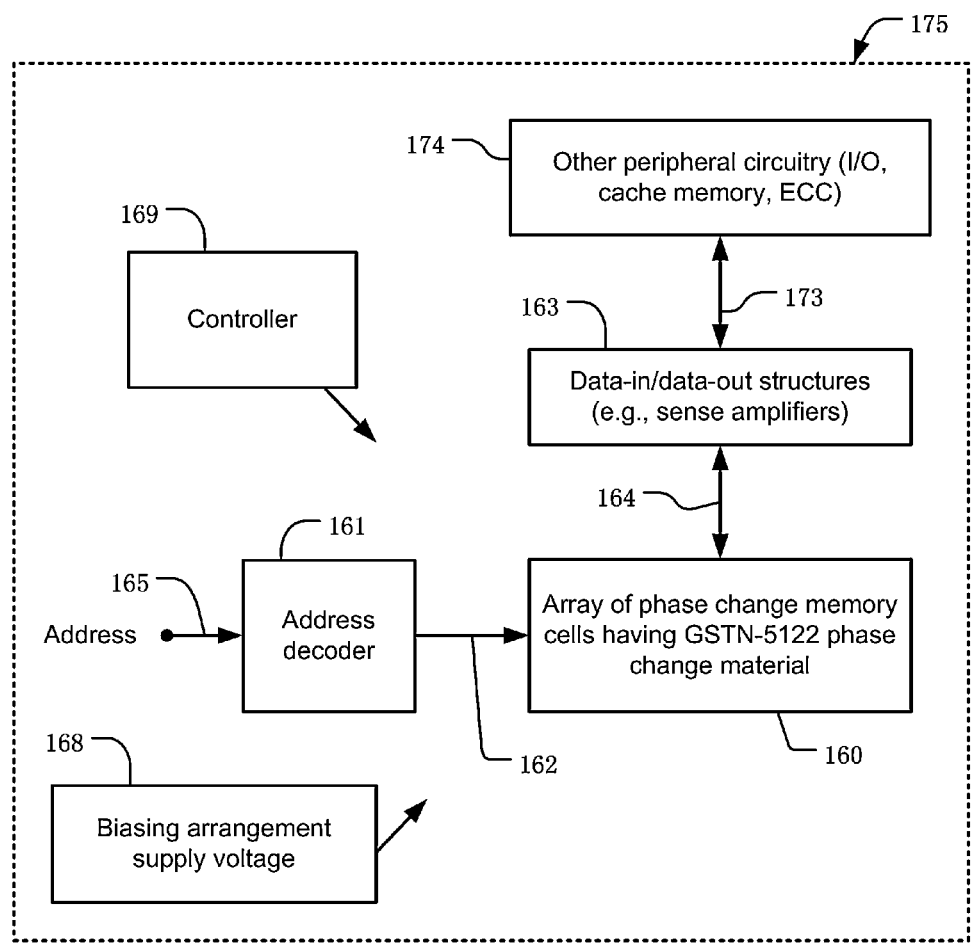
FIG. 14 is a simplified block diagram of a memory.

FIG. 14 is a simplified block diagram of an example memory 175. The memory 175 includes an array 160 of phase change memory cells having GSTN-5122 phase change material. For example, the array 160 can include memory cells 501 illustrated in FIG. 5.

An address decoder 161 is coupled to the array 160 via lines 162. Addresses are supplied on bus 165 to the address decoder 161. The address decoder 161 can include word-line decoder, bit-line decoder, and other suitable decoders that decode the supplied addresses and select corresponding memory cells in the array 160.

Bit lines in the array 160 are coupled via lines 164 to data-in or data-out structures 163 such as sense amplifiers, data buffers, and circuitry providing voltage or current for read, set, and reset operations. The data-in/data-out structures 163 in turn are coupled to other peripheral circuitry 174 via lines 173.

Peripheral circuitry includes circuits that are formed using logic circuits or analog circuits that are not part of the array 160, such as the address decoder 161, controller 169, biasing arrangement supply voltage block 168, and so on. In this example, the block 174 labeled other peripheral circuitry can include input-output (I/O) circuits, cache memory, error-code-correction (ECC) circuit, and other circuit components on the memory 175, such as a general purpose processor or special-purpose application circuitry, or a combination of modules providing system-on-a-chip functionality supported by the array 160. Data is supplied via the lines 173 to I/O ports or to other data destinations internal or external to the memory 175. Data to and from the array 160 can be stored (cached) in the cache memory. The ECC circuit can perform ECC functions (e.g., parity check) on the cached data to ensure integrity of the data to and from the array 160.

The controller 169, implemented for example as a state machine, provides signals to control the application of bias arrangement supply voltage generated or provided through the voltage supply or supplied in block 168 to carry out the various operations described herein. These operations include read operations, set operations, and reset operations. The controller is coupled to the address decoder 161, the data-in/data-out structures 163, and the other peripheral circuitry 174. The controller can be implemented using special-purpose logic circuitry as known in the art. In other embodiments, the controller comprises a general-purpose processor, which may be implemented on the same memory 175, which executes a computer program to control the operations of the device. In yet other embodiments, a combination of special-purpose logic circuitry and a general-purpose processor may be utilized for implementation of the controller.

Figure 15:
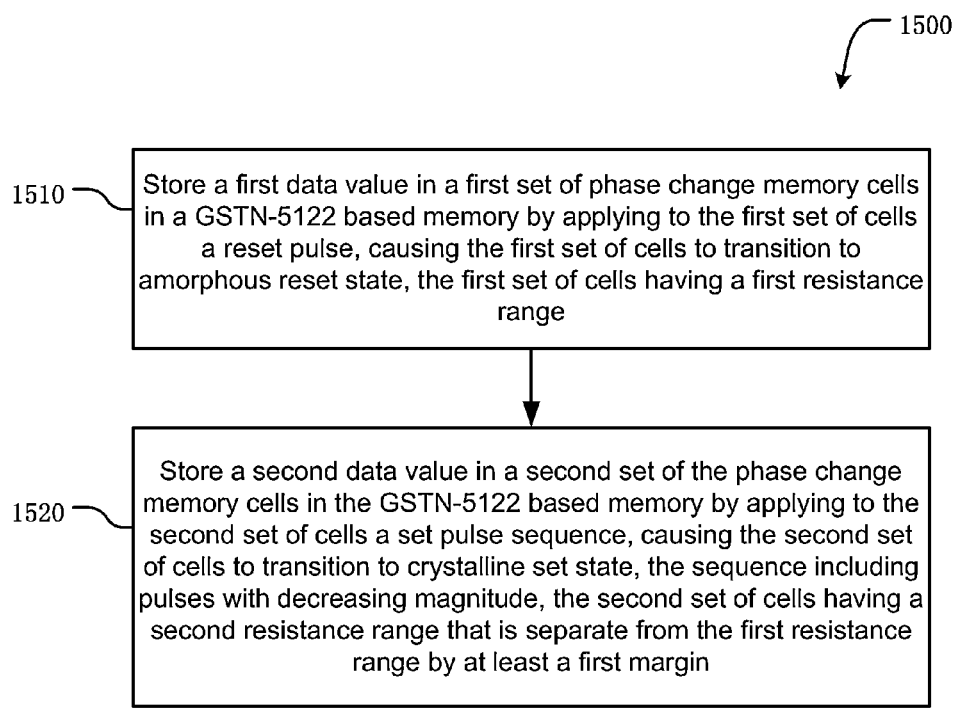
FIG. 15 illustrates an example method for programming a phase change memory.

FIG. 15 illustrates an example method 1500 for programming a phase change memory including phase change memory cells based on GSTN-5122 phase change material, such as the memory 175 illustrated in FIG. 14. The method includes pre-mount coding or pre-coding operations that store data in the phase change memory before the memory is mounted to a substrate by applying a reset pulse and a sequence of set pulses. The method 1500 can be carried out by logic implemented by the memory 175. For example, the method 1500 can be implemented by the controller 169 of the memory 175.

For illustrative purposes, a phase change memory cell in the crystalline set state has a logic value of 0. A phase change memory cell in the amorphous reset state has a logic value of 1. The controller 169 can receive (e.g., from a manufacturing equipment) a pre-mount program instruction that includes data values (0's and 1's) and corresponding addresses of the phase change memory cells in the memory array 160. In response to the pre-mount program instruction, At step 1510, in response to the pre-mount program instruction, the controller 169 stores data values of 1 in the first set of cells (pre-mount program instruction) by applying to the first set of cells (e.g., through biasing arrangement supply voltage 168) a reset pulse, causing the first set of cells to transition to the amorphous reset state. The first set of cells in the amorphous reset state has a first resistance range. For example, the controller 169 can apply to the first set of cells a reset pulse having a waveform including an amplitude of 2V in word-line voltage, a 19-nanoseconds leading edge, a 40-nanoseconds pulse width, and 2-nanoseconds trailing edge, as described with FIG. 13. The first set of cells has a resistance range (corresponding to curve 1301) of about $10^{6.8}\Omega$ to $10^{9.6}\Omega$.

The controller 169 stores data values of 0 in the second set of cells (pre-mount program instruction) by applying to the second set of cells (e.g., through biasing arrangement supply voltage 168) a sequence of set pulses, causing the second set of cells to transition to the crystalline set state. The sequence of set pulses (e.g., the sequence E illustrated in FIG. 10) includes pulses with decreasing magnitudes, and each pulse has a trailing edge that's longer than the leading edge. The second set of cells has a second resistance range that is separate from the first resistance range (of the first set of cells) by at least a first margin. For example, as illustrated in FIG. 13, the second set of cells has a resistance range about $10^4\Omega$ to $10^{5.1}\Omega$ (the curve 1311 corresponding to the sequence E). The first margin between the first and second resistance ranges is about 50× as described earlier.

After the pre-coding operations are completed, the memory 175 is mounted to a substrate such as a PCB board. The mounting process includes a solder reflow process. The solder reflow process subjects the memory 175 to one or more thermal cycles that can reach an elevated reflow temperature of about 260° C.

After mounting, a minimal resistance value of the first resistance range (for reset resistance of the first set of cells in the amorphous reset state) increases. For example, in FIG. 13, the minimal reset resistance is increased from about $10^{6.8}\Omega$ for curve 1301 to about $10^7\Omega$ for curve 1302. Meanwhile, a second margin (after the mounting of the memory 175) between the first resistance range and the second resistance range is decreased from the first margin. For example, as illustrated in FIG. 13, the read margin is decreased from 50× before the mounting to 5× after the mounting, due to the increase in the maximal set resistance from curve 1311 to 1312. However, the reduced read margin is still sufficient to separate the second set of cells in the crystalline set state from the first set of cells in the amorphous reset state.

In addition, after the mounting (e.g., when the memory 175 is deployed in the field), different set and reset pulses can be used to program the memory 175, since the memory 175 is no longer subject to the elevated reflow temperature. For example, the memory 175 can receive a post-mount program instruction from a host system incorporating the memory 175. The post-mount program instruction includes data values 0's and 1's and corresponding addresses of the phase change memory cells in the memory array 160. In response to the post-mount program instruction, the controller 169 stores data values of 1 in a third set of cells (based on the post-mount program instruction) by, for example, causing the biasing arrangement supply voltage 168 to apply to the third set of cells a reset pulse with an amplitude sufficient to cause the third set of cells to transition to the amorphous reset state (e.g., word-line voltage of 1.5V as described with FIG. 8), instead of a reset pulse with high amplitude used before the mounting (e.g., word-line voltage of 2.5V as described with FIGS. 8 and 13). As shown in FIG. 8, the minimal reset resistance resulted from the reset pulse in word-line voltage of 1.5V is about $10^{6.8}\Omega$. The controller 169 stores data values of 0 in a fourth set of cells (based on the post-mount program instruction) by, for example, causing the biasing arrangement supply voltage 168 to apply a single set pulse (instead of a sequence of set pulses used before the mounting) to the fourth set of cells, causing the fourth set of cells to transition to the crystalline set state. As shown in FIG. 9B, the maximal set resistance resulted from a single set pulse of 1.25V is about $10^{5.5}\Omega$. Thus a read margin of about 20× (between $10^{6.8}\Omega$ and $10^{5.5}\Omega$) is achieved. Here, the first, second, third, and the fourth sets of cells are not necessarily the same, different, or overlapping.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A phase change memory device, comprising:
a plurality of phase change memory cells, each phase change memory cell being configurable between a crystalline set state and an amorphous reset state; and
a circuit coupled to the phase change memory cells, the circuit being configured to, in response to a pre-mount program instruction, perform pre-mount coding operations before the device is mounted to a substrate, the pre-mount coding operations including:
storing a first data value in a first set of the phase change memory cells by applying to the first set of cells a reset pulse, causing the first set of cells to transition to the amorphous reset state, the first set of cells in the amorphous reset state having a first resistance range; and
storing a second data value in a second set of the phase change memory cells by applying to the second set of cells a set pulse sequence, causing the second set of cells to transition to the crystalline set state, the sequence including pulses with decreasing magnitudes, the pulses having a leading edge, a pulse width, and a trailing edge that is longer than the leading edge, the second set of cells in the crystalline set state having a second resistance range that is separate from the first resistance range by at least a margin.

2. The phase change memory device of claim 1, wherein the phase change memory cells comprising a phase change material having a crystallization temperature greater than 410° C., the phase change material comprising $Ge_w Sb_x Te_y N_z$, wherein w, x, y, and z are positive, non-zero variables, a Ge atomic concentration $w/(w+x+y+z)$ is within a range from 43% to 54%, a Sb atomic concentration $y/(w+x+y+z)$ is within a range from 6% to 13%, a Te atomic concentration $y/(w+x+y+z)$ is within a range from 14% to 23%, and a N atomic concentration $z/(w+x+y+z)$ is within a range of 15% to 27%.

3. The phase change memory device of claim 2, wherein the Ge atomic concentration is 48.8%, the Sb atomic concentration is 10.3%, the Te atomic concentration is 19.3%, and the N atomic concentration is 21.6%.

4. The phase change memory device of claim 2, wherein the w is about 5, the x is about 1, the y is about 2, and the z is about 2.

5. The phase change memory device of claim 1, wherein a maximal resistance value of the second resistance range decreases with an increase in a magnitude of an initial pulse of the set pulse sequence.

6. A phase change memory device, comprising:
a plurality of phase change memory cells, each phase change memory cell being configurable between a crystalline set state and an amorphous reset state; and
a circuit coupled to the phase change memory cells, the circuit being configured to, in response to a pre-mount program instruction, perform pre-mount coding operations before the device is mounted to a substrate and, in response to a post-mount program instruction, perform post-mount coding operations after the device is mounted to the substrate, the pre-mount coding operations including:
a first operation including storing a first data value in a first set of the phase change memory cells by applying to the first set of the phase change memory cells a first reset pulse, causing the first set of the phase change memory cells to transition to the amorphous reset state, the first set of cells in the amorphous reset state having a first resistance range; and a second operation including storing a second data value in a second set of the phase change memory cells by applying to the second set of cells a set pulse sequence, causing the second set of the phase change memory cells to transition to the crystalline set state, the sequence including first set pulses with decreasing magnitudes, the first set pulses having a leading edge, a pulse width, and a trailing edge that is longer than the leading edge, the second set of cells in the crystalline set state having a second resistance range that is separate from the first resistance range by at least a first margin; and the post-mount coding operations including:
a third operation including storing the first data value in a third set of the phase change memory cells by applying to the third set of cells a second reset pulse, causing the third set of cells to transition to the amorphous reset state, the second reset pulse having an amplitude smaller than an amplitude of the first reset pulse, the third set of cells in the amorphous reset state having a third resistance range; and a fourth operation including storing the second data value in a fourth set of the phase change memory cells by applying to the fourth set of cells a second set pulse, causing the fourth set of the phase change memory cells to transition to the crystalline set state, the second set pulse having a leading edge, a pulse width, and a trailing edge that is longer than the leading edge, the fourth set of cells in the crystalline set state having a fourth resistance range that is separate from the third resistance range by a second margin.

7. The phase change memory device claim 6, wherein the phase change memory cells comprising a phase change material having a crystallization temperature greater than 410° C., the phase change material comprising $Ge_wSb_xTe_yN_z$, wherein w, x, y, and z are positive, non-zero variables, a Ge atomic concentration w/(w+x+y+z) is within a range from 43% to 54%, a Sb atomic concentration x/(w+x+y+z) is within a range from 6% to 13%, a Te atomic concentration y/(w+x+y+z) is within a range from 14% to 23%, and a N atomic concentration z/(w+x+y+z) is within a range of 15% to 27%.

8. The phase change memory device of claim 7, wherein the Ge atomic concentration is 48.8%, the Sb atomic concentration is 10.3%, the Te atomic concentration is 19.3%, and the N atomic concentration is 21.6%.

9. The phase change memory device of claim 7, wherein the w is about 5, the x is about 1, the y is about 2, and the z is about 2.

10. The phase change memory device of claim 6, wherein a maximal resistance value of the second resistance range decreases with an increase in a magnitude of an initial pulse of the set pulse sequence.

11. The phase change memory device of claim 6, wherein a minimal resistance value of the first resistance range increases after the device is mounted to the substrate.

12. A method for manufacturing a circuit including a phase change memory, the phase change memory comprising a plurality of phase change memory cells, each phase change memory cell being configurable between a crystalline set state and an amorphous reset state, the method comprising:
performing pre-mount coding operations before the circuit is mounted to a substrate, including:
storing a first data value in a first set of the phase change memory cells by applying to the first set of cells a reset pulse, causing the first set of cells to transition to the amorphous reset state, the first set of cells in the amorphous reset state having a first resistance range; and storing a second data value in a second set of the phase change memory cells by applying to the second set of cells a set pulse sequence, causing the second set of cells to transition to the crystalline set state, the sequence including pulses with decreasing magnitudes, the pulses having a leading edge, a pulse width, and a trailing edge that is longer than the leading edge, the second set of cells in the crystalline set state having a second resistance range that is separate from the first resistance range by at least a first margin.

13. The method of claim 12, wherein the mounting of the circuit to the substrate includes subjecting the circuit to a thermal cycle.

14. The method of claim 12, wherein after mounting of the circuit to the substrate:
a minimal resistance value of the first resistance range increases; and
the second resistance range is separate from the first resistance range by at least a second margin.

15. The method of claim 14, wherein the second margin is smaller than the first margin.

16. The method of claim 12, wherein a maximal resistance value of the second resistance range decreases with an increase in a magnitude of an initial pulse of the set pulse sequence.

17. The method of claim 12, wherein the phase change memory cells comprising a phase change material having a crystallization temperature greater than 410° C., the phase change material comprising $Ge_wSb_xTe_yN_z$, wherein w, x, y, and z are positive, non-zero variables, a Ge atomic concentration w/(w+x+y+z) is within a range from 43% to 54%, a Sb atomic concentration x/(w+x+y+z) is within a range from 6% to 13%, a Te atomic concentration y/(w+x+y+z) is within a range from 14% to 23%, and a N atomic concentration z/(w+x+y+z) is within a range of 15% to 27%.

18. The method claim 17, wherein the Ge atomic concentration is 48.8%, the Sb atomic concentration is 10.3%, the Te atomic concentration is 19.3%, and the N atomic concentration is 21.6%.

19. The method of claim 17, wherein the w is about 5, the x is about 1, the y is about 2, and the z is about 2.

20. The method of claim 12, wherein the circuit includes logic performing the pre-mount coding operations.

* * * * *